April 28, 1970 T. F. ORIGER ET AL 3,508,983

USE OF A SILANE COATING TO BOND COPPER TO PLASTIC
IN MAKING A PRINTED CIRCUIT

Filed April 24, 1967

INVENTORS
HERBERT J. FICK
TERRENCE F. ORIGER
BY Meyers & Peterson
ATTORNEYS

United States Patent Office 3,508,983
Patented Apr. 28, 1970

3,508,983

USE OF A SILANE COATING TO BOND COPPER TO PLASTIC IN MAKING A PRINTED CIRCUIT

Terrence F. Origer, Northfield, Minn., and Herbert J. Fick, London, England, assignors to G. T. Schjeldahl Company, Northfield, Minn., a corporation of Minnesota Continuation-in-part of application Ser. No. 358,778, Apr. 10, 1964. This application Apr. 24, 1967, Ser. No. 634,423
Int. Cl. C23f *1/02*
U.S. Cl. 156—3 3 Claims

ABSTRACT OF THE DISCLOSURE

A technique for the preparation of an improved printed circuitry laminate structure utilizing the steps of deoxidizing a copper surface, applying a film of gamma-aminopropyl triethoxysilane to the deoxidized surface, thereafter bonding the treated copper to a substrate surface utilizing a polyester base adhesive.

The present invention relates generally to an improved technique for preparing copper-plastic laminate structures, and more particularly to an improved copper-plastic laminate wherein the copper is provided with a silane coating along the surface which is bonded to the plastic material, the present application being a continuation-in-part of our application Ser. No. 358,778, filed Apr. 10, 1964, entitled "Coating for Copper-Plastic Laminates," and assigned to the same assignee as the present application.

In the preparation of printed wiring or printed circuits, and particularly in the preparation of flexible printed circuits these circuits are initially formed by the steps of laminating a copper foil to a plastic film including such films as polyolefins including polyethylene or others such as polyethylene terephthalate, Teflon FEP, and the like, Teflon FEP containing fluorinated ethylene propylene. Films of this type are commercially available and are widely used in the preparation of printed circuits today. In order to establish a bond between the copper foil and the plastic substrate, copper is normally bonded to the plastic by means of a polyester adhesive or the like. The application of silane coating in accordance with the present invention to the copper foil will serve to provide a protective layer for the copper and will also aid in curing the adhesive film. In other words, the silane mixture will promote the cure of the polyester adhesive. Subsequent to the preparation of the laminate structure, a suitable etch pattern is arranged along the surface of the copper, such as, for example, by means of coating selected areas of the exposed copper surface with a suitable etch resistant composition. The etch-resistant material may be applied to the surface of the copper by any suitable means such as by using a photosensitive etch resist, or by silk screening or otherwise painting the etch resist on to the copper. The laminate thus prepared is then etched by means of exposure to a standard etching solution, such as cupric chloride or the like, wherein the unprotected copper is etched away. Of course, other suitable etching solutions including ferric chloride and the like may be employed as well. In the case of a ferric chloride etch, it is general practice to clean the printed wiring by means of initially dipping in a 10 percent solution of hydrochloric acid.

Certain etching solutions, specifically cupric chloride, produce an undesirable side effect in thin flexible printed wiring known as "delamination." The phenomena is manifested by lifting of the conductive material from the adhesive surface. This problem is believed to develop because of attack by corrosive halogen present in the etching bath on the copper surface adjacent the adhesive surface of the plastic substance. In accordance with the present invention, "delamination" has been substantially eliminated, and the bond strength between the copper foil and the plastic substrate has been substantially enhanced. Generally speaking, the bond strength between the copper and the plastic substrate is increased by about 30 percent. The treated surfaces are found to be resistant to oxidation over an extended period of time, and the electrical properties of the laminates or printed circuits prepared therefrom are not adversely affected. Delamination may also occur when the printed circuit material is subjected to certain plating baths such as gold cyanide, lead fluoroborate and the like. Treatment in accordance with the present invention protects the printed circuit material from these adverse effects.

Briefly in accordance with the technique of the present invention, the copper surface which is being bonded to the plastic substrate is initially cleaned, and rendered substantially oxide free. Subsequentially, the copper surface is coated with a thin film of gamma-aminopropyl triethoxysilane, the silane material being applied to the surface of the copper either by straying, dipping, or wiping, and this surface is bonded to the plastic layer. The printed wiring or printed circuits are then prepared by conventional application of a photosensitive etch resist to the surface of the copper, followed by an etching of the unwanted portions of the copper laminate.

Therefore, it is an object of the present invention to provide an improved technique for enhancing the adhesive bonding available between a film of a plastic substrate and a copper foil.

It is a further object of the present invention to improve the bond and reduce the delaminating effects between the surface of a copper foil and the adhesive surface adjacent a plastic substrate, the improvement being due to the preparation of a film of gamma-aminopropyl triethoxysilane along the surface of the copper metal.

It is still a further object of the present invention to provide an improved etch-resistant bond between the adhesive interface between the surface of a copper foil and the surface of a plastic film substrate, wherein the copper is provided with a surface adherent coating of gamma-aminopropyl triethoxysilane.

Other objects of the present invention will become apparent to those skilled in the art upon a study of the following specification, appended claims, and accompanying drawing wherein:

Figure 1:
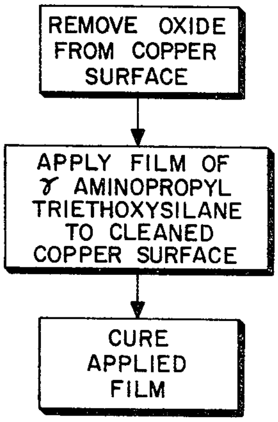
FIGURE 1 is a flow diagram illustrating the various steps which are utilized in carrying out the aspects of the present invention.
Figure 2:
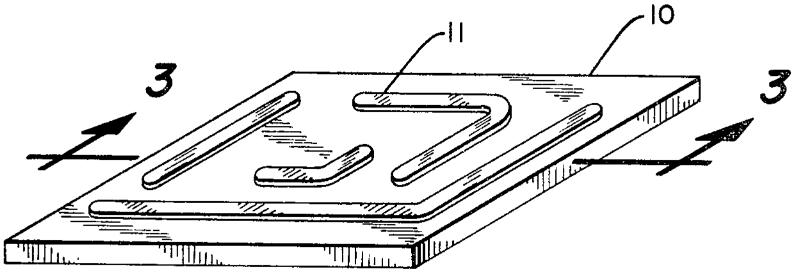
FIGURE 2 is a perspective view of a printed circuit prepared in accordance with the techniques of the present invention.
Figure 3:
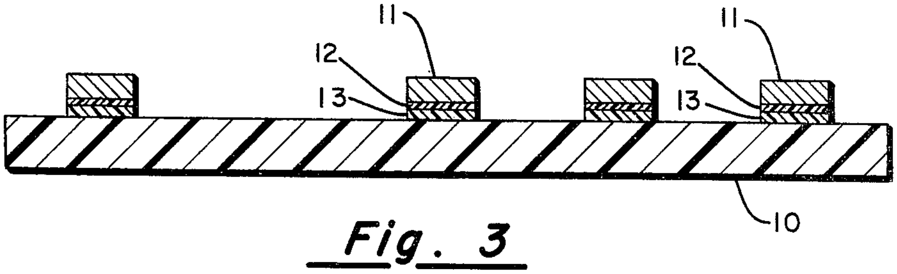
FIGURE 3 is a vertical sectional view taken along the line and in the direction of the arrows 3—3 of FIGURE 2, and illustrating the various active layers which are employed in a film fabricated in accordance with the present invention.

In accordance with the preferred embodiment of the present invention, a plastic film, such as, for example, a film of stress-oriented polyethylene terephthalate available under the trade name of "Mylar" from the E. I. du Pont de Nemours Corp. of Wilmington, Del., is selected. With reference to FIGURE 2, the surface of the polyethylene terephthalate base 10 is prepared to receive a layer of copper bonded thereto, the copper being adhesively bonded to the surface of the plastic film base. Polyester base adhesives have been found useful in this regard, these adhesives being commercially available. Particular adhesives of this type are those various thermoplastic polyester adhesives disclosed in the patent to Dye, U.S. Patent 2,892,747, which adhesives are commercially available. In addition, this polyester can be modified through the use of an isocyanate ingredient, such as, for example, toluene diisocyanate for example, 1 isocyanate ingredient being sold by the E. I. du Pont de Nemours Corp. of Wilmington, Del. under their code name RC–805. The surface of the copper member 11 which is to be bonded to the substrate layer is preferably treated for oxide removal, and then treated by applying a film of gamma-aminopropyl triethoxysilane thereto as shown at 12. The silane coating is applied to the copper surface either full strength, or diluted, such as, for example, a solution of 0.5 percent in either water or organic solvents. The application may occur either by spraying, dipping, or wiping on to the copper surface. The material is permitted to dry, whereupon the silane cures to a uniformly adhering cohesive film. The treated copper is then bonded to the surface of the plastic by the polyester adhesive as at 13.

In one specific example, a layer of electrolytic tough pitch copper, weighing one ounce per square foot, and consisting of a minimum of about 99.5 percent copper was treated to remove any oxide film from the surface thereof, this being accomplished by exposure through immersion and spraying with an aqueous solution containing 5 percent ammonium persulfate. A solution containing from about 2 percent to about 10 percent of ammonium persulfate may be used. Other proprietary copper cleaning agents may be employed in order to remove the oxide film from the copper, these proprietary cleaners being commercially available. The silane material is then sprayed onto the surface of the copper, the spray solution being a 0.5 percent solution of gamma-aminopropyl triethoxysilane in water. The silane material was permitted to dry at a temperature of about 120° F. and the treated surface was then bonded to a film of polyethylene terephthalate by a polyester adhesive. The copper-polyethylene terephthalate laminate was then covered with a layer of KPR photo-resist, and a negative of the desired pattern was cast onto the resist layer, the remainder being exposed until an acid resisting pattern was obtained on the exposed area. Other suitable acid etchant resists may be employed with equal success, no claim being made to the use of any specific acid resist. The laminate was then subjected to an aqueous etching bath of cupric chloride, the etching bath including cupric chloride in a concentration of 16–20 ounces per gallon in water with hydrochloric acid at a concentration of from 3 percent to 5 percent until the exposed copper is removed. The cupric chloride may be present in the etching bath at a concentration of up to about 16 ounces per gallon. The properties of the etched product are found to be ideal from the standpoint of printed circuit preparation, the laminate being free from the effect of "delamination" which is commonly found in etched or plated laminate products which have not been previously treated with the gamma-aminopropyl triethoxysilane of the present invention.

The bond strength over the copper-to-substrate area is substantially enhanced, and the insulation resistance is not affected. The copper laminates having the silane coating thereon are found to be resistant to the same solvents as untreated copper laminate, and in addition, the surface of the treated copper is resistant to oxide formation upon continued exposure to air at 140° F. for periods in excess of 14 days. Many adhesive mixtures employing a polyester base material utilize a polyisocyanate mixture to enhance the cure and provide more desirable properties in the finished adhesives. The gamma-aminopropyl triethoxysilane, with the amine group positioned at the terminal end of the molecule, serves to enhance the cure of the urethane linkage in these polyester adhesives.

In the use of an aromatic diisocyanate in the over-all mixture, it is generally preferred that the ratio of reactance be balanced so that there are substantially equivalent amounts of polyester and glycol to aromatic diisocyanate so that there remain no free unreacted aromatic diisocyanate or glycols after the reaction. In this connection, specific ratios of reactance are set forth in that U.S. patent to Schollenberger, No. 3,015,650. The Schollenberger patent describes thermoplastic polyester urethanes which are the linear reaction products of hydroxyl polyesters of aliphatic glycols containing three or more carbon atoms and a phthalic acid with an aromatic diisocyanate and an aliphatic glycol. The hydroxyl polyesters have a molecular weight of between about 282 and 2500, and an acid number less than 10, the polyesters being essentially hydroxyl terminated polyesters.

While specific examples and embodiments of the invention are disclosed herein, it will be appreciated that departures may be made from these specific examples without departing from the spirit and scope of the present invention. Therefore, it is not intended that the scope of the invention be restricted to these specific embodiments alone.

What is claimed is:

1. In the method of preparing laminated printed wiring consisting esentially of an insulated base member having a copper layer bonded thereto, and wherein a printed pattern is etched along the surface of the copper laminate member; said method comprising the stages of removing the oxide coating from a first surface of a copper film, applying a dilute solution of about ½ of 1% of gamma-aminopropyl triethoxysilane to said oxide-free surface, removing the solvent to provide said oxide-free surface with a layer of gamma-aminopropyl triethoxysilane, and applying a layer of a polyester base adhesive to said coated first surface, said adhesive including, as a curing agent, a quantity of an aromatic diisocyanate, bonding said copper layer to said insulating base member, and thereafter etching a predetermined pattern into said copper layer.

2. The method as set forth in claim 1 being particularly characterized in that said curing agent is toluene diisocyanate.

3. The method as set forth in claim 1 being particularly characterized in that said adhesive comprises a mixture of from 40 mol percent up to about 60 mol percent polyethylene terephthalate, balance polyethylene sebacate.

References Cited

UNITED STATES PATENTS

| | | | |
|---|---|---|---|
| 2,765,251 | 10/1956 | Williams | 161—227 |
| 3,088,847 | 5/1963 | Pines | 117—75 |
| 3,305,416 | 2/1967 | Kahan et al. | 156—3 |
| 3,085,908 | 4/1963 | Morehouse et al. | 117—127 |

OTHER REFERENCES

Polyesters and Their Applications, by Bjorksten Research Lab. Inc., Rheinhold Pub. Corp., N.Y., cpw. 1956, pages 225 and 226.

JACOB H. STEINBERG, Primary Examiner

U.S. Cl. X.R.

117—127; 161—214, 227